US009966929B2

(12) United States Patent
Takamine

(10) Patent No.: US 9,966,929 B2
(45) Date of Patent: May 8, 2018

(54) DUPLEXER INCLUDING A LOW-PASS FILTER CAPACITOR

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 141 days.

(21) Appl. No.: 14/872,428

(22) Filed: Oct. 1, 2015

(65) Prior Publication Data

US 2016/0028366 A1    Jan. 28, 2016

Related U.S. Application Data

(63) Continuation of application No. PCT/JP2013/083188, filed on Dec. 11, 2013.

(30) Foreign Application Priority Data

Apr. 10, 2013    (JP) ................... 2013-081790

(51) Int. Cl.
*H03H 9/72*    (2006.01)
*H03H 9/64*    (2006.01)
(Continued)

(52) U.S. Cl.
CPC .......... *H03H 9/725* (2013.01); *H03H 9/0576* (2013.01); *H03H 9/6433* (2013.01);
(Continued)

(58) Field of Classification Search
CPC ............ H03H 9/0028; H03H 9/02818; H03H 9/0576; H03H 9/64; H03H 9/6406;
(Continued)

(56) References Cited

U.S. PATENT DOCUMENTS 6,380,827 B1    4/2002   Noguchi
6,404,303 B1 *  6/2002   Kuroda ............... H03H 9/0542
                                                    333/193
(Continued)

FOREIGN PATENT DOCUMENTS

JP    08-065089 A  *  3/1996
JP    11-041055 A  *  2/1999
(Continued)

OTHER PUBLICATIONS

English language machine translation of JP 2010-178063 A, published Aug. 12, 2010, 8 pages.*
(Continued)

*Primary Examiner* — Barbara Summons
(74) *Attorney, Agent, or Firm* — Keating & Bennett, LLP

(57) ABSTRACT

A duplexer includes a first band-pass filter and a second band-pass filter with a pass-band lower than the first band-pass filter. The first band-pass filter includes an unbalanced surface acoustic wave filter. First, second and third signal wire electrodes and a ground wire electrode are provided on a piezoelectric substrate in the first band-pass filter, and a bridging area is provided where any one of the first, second and third signal wire electrodes bridges the ground wire electrode. A width of a portion of the signal wire electrode that opposes the ground wire electrode with an interlayer insulating film located therebetween is greater than a width of a portion of the signal wire electrode other than the bridging area so that a low-pass filter capacitor is provided.

20 Claims, 4 Drawing Sheets

(51) Int. Cl.
*H03H 9/05* (2006.01)
*H03H 9/00* (2006.01)

(52) U.S. Cl.
CPC ........ *H03H 9/6479* (2013.01); *H03H 9/6493* (2013.01); *H03H 9/0028* (2013.01)

(58) Field of Classification Search
CPC .... H03H 9/6423; H03H 9/6436; H03H 9/644; H03H 9/6479; H03H 9/6483; H03H 9/6489; H03H 9/6493; H03H 9/725; H03H 9/6433
USPC .......................................... 333/133, 193–195
See application file for complete search history.

(56) References Cited

U.S. PATENT DOCUMENTS

| | | | | |
|---|---|---|---|---|
| 6,844,795 | B2 * | 1/2005 | Inose | H03H 9/6493 310/313 B |
| 7,872,548 | B2 * | 1/2011 | Nishihara | H03H 9/0576 333/133 |
| 7,915,975 | B2 * | 3/2011 | Bauer | H03H 9/0028 333/193 |
| 2002/0135267 | A1 | 9/2002 | Takamine | |
| 2004/0196119 | A1 | 10/2004 | Shibahara et al. | |
| 2010/0225418 | A1 | 9/2010 | Kawamoto et al. | |
| 2011/0080234 | A1 | 4/2011 | Haruta | |
| 2011/0175689 | A1 | 7/2011 | Omura et al. | |
| 2011/0181372 | A1 | 7/2011 | Fujita | |
| 2012/0086520 | A1 | 4/2012 | Yamamoto et al. | |
| 2014/0176258 | A1 | 6/2014 | Yasuda | |

FOREIGN PATENT DOCUMENTS

| | | |
|---|---|---|
| JP | 2000-349591 A | 12/2000 |
| JP | 2002-208832 A | 7/2002 |
| JP | 2004-282707 A | 10/2004 |
| JP | 2007-259023 A | 10/2007 |
| JP | 2010-178063 A * | 8/2010 |
| JP | 2010-239612 A | 10/2010 |
| JP | 2011-086997 A | 4/2011 |
| JP | 2011-151553 A | 8/2011 |
| JP | 2012-157078 A | 8/2012 |
| JP | 2012-205215 A | 10/2012 |
| JP | 2013-9411 A | 1/2013 |
| KR | 10-2004-0076222 A | 8/2004 |
| WO | 2009/153916 A1 | 12/2009 |
| WO | 2010/052821 A1 | 5/2010 |
| WO | 2010/150598 A1 | 12/2010 |
| WO | 2013/031726 A1 | 3/2013 |

OTHER PUBLICATIONS

English language machine translation of JP 2007-259023 A, published Oct. 4, 2007, 7 pages.*
English language machine translation of JP 11-041055 A, published Feb. 12, 1999, 3 pages.*
English language machine translation of JP 08-065089 A, published Mar. 8, 1996, 7 pages.*
Official Communication issued in corresponding Japanese Patent Application No. 2015-511075, dated Feb. 16, 2016.
Official Communication issued in corresponding Korean Patent Application No. 10-2015-7027555, dated Jul. 20, 2016.
Official Communication issued in International Patent Application No. PCT/JP2013/083188, dated Jan. 28, 2014.

* cited by examiner

COMPARATIVE EXAMPLE

DUPLEXER INCLUDING A LOW-PASS FILTER CAPACITOR

BACKGROUND OF THE INVENTION

1. Field of the Invention

The present invention relates to duplexers including first and second band-pass filters that have different pass-bands, and particularly relates to duplexers in which the first band-pass filter includes an unbalanced surface acoustic wave filter.

2. Description of the Related Art

Various duplexers that use surface acoustic wave filters have been proposed thus far. For example, Japanese Unexamined Patent Application Publication No. 2000-349591, described hereinafter, discloses a SAW duplexer including a transmission filter and a reception filter. In Japanese Unexamined Patent Application Publication No. 2000-349591, the reception filter is configured of a longitudinally coupled resonator-type surface acoustic wave filter. The reception filter configured of a longitudinally coupled resonator-type surface acoustic wave filter described in Japanese Unexamined Patent Application Publication No. 2000-349591 has an unbalanced input terminal and an unbalanced output terminal. In other words, the reception filter is an unbalanced surface acoustic wave filter.

Thus far, the stated unbalanced surface acoustic wave filter and a balanced surface acoustic wave filter that can obtain a balanced output have been known as surface acoustic wave filters used as reception filters in duplexers. The balanced surface acoustic wave filter can increase harmonic attenuation through balance between balanced output terminals.

On the other hand, in the case where an unbalanced surface acoustic wave filter such as that described in Japanese Unexamined Patent Application Publication No. 2000-349591 is used, it has been difficult to increase the harmonic attenuation. When the harmonic attenuation is low, there is a risk that a noise signal outputted from a voltage controlled oscillator (VC) will combine with the harmonic, resulting in an unnecessary signal being produced. There is thus a risk that the reception sensitivity will drop.

SUMMARY OF THE INVENTION

Preferred embodiments of the present invention provide a duplexer capable of increasing harmonic attenuation.

A first preferred embodiment of the present invention is a duplexer including a first band-pass filter and a second band-pass filter whose pass-band is located on a lower-frequency side than the first band-pass filter.

According to the first preferred embodiment of the present invention, the first band-pass filter includes an unbalanced surface acoustic wave filter having an unbalanced input-unbalanced output. The first band-pass filter includes a piezoelectric substrate and an electrode structure provided on the piezoelectric substrate. The electrode structure includes an input electrode pad, an output electrode pad, a ground electrode pad that is shunted to ground, a functional electrode portion that defines and functions as a surface acoustic wave filter including at least one interdigital transducer electrode, a first signal wire electrode that connects the functional electrode portion and the input electrode pad, a second signal wire electrode through which a signal current flows within the functional electrode portion, a third signal wire electrode that connects the functional electrode portion and the output electrode pad, and a ground wire electrode that connects the functional electrode portion and the ground electrode pad.

According to the first preferred embodiment of the present invention, provided is a bridging area where any one of the first, second and third signal wire electrodes bridges the ground wire electrode. An interlayer insulating film is provided in the bridging area between the ground wire electrode and the stated signal wire electrode. A width of a portion of the signal wire electrode that opposes the ground wire electrode with the interlayer insulating film located therebetween is preferably greater than a width of a portion of the signal wire electrode other than the bridging area so as to configure a low-pass filter capacitor.

A second preferred embodiment of the present invention is a duplexer including a first band-pass filter and a second band-pass filter whose pass-band is located on a lower-frequency side than the first band-pass filter. According to the second preferred embodiment of the present invention as well, the first band-pass filter includes an unbalanced surface acoustic wave filter including an unbalanced input-unbalanced output.

According to the second preferred embodiment of the present invention, the surface acoustic wave filter includes a piezoelectric substrate and an electrode structure provided on the piezoelectric substrate. According to the second preferred embodiment of the present invention, the electrode structure includes an input electrode pad, an output electrode pad, a ground electrode pad that is shunted to ground, a functional electrode portion that defines and functions as a surface acoustic wave filter having at least one interdigital transducer electrode, a first signal wire electrode that connects the functional electrode portion and the input electrode pad, a second signal wire electrode through which a signal current flows within the functional electrode portion, a third signal wire electrode that connects the functional electrode portion and the output electrode pad, and a ground wire electrode that connects the functional electrode portion and the ground electrode pad.

According to the second preferred embodiment of the present invention, a ground electrode pad extending portion that extends from the ground electrode pad and is not electrically connected to the functional electrode portion is further provided. The ground electrode pad extended portion overlaps with any one of the first, second and third signal wire electrodes with an interlayer insulating film located therebetween so as to define a low-pass filter capacitor.

In a duplexer according to a preferred embodiment of the present invention, it is preferable that the ground wire electrode be disposed between the interlayer insulating film and the piezoelectric substrate in the area where the low-pass filter capacitor is provided.

In a duplexer according to a preferred embodiment of the present invention, it is preferable that the unbalanced surface acoustic wave filter be a longitudinally coupled resonator-type surface acoustic wave filter.

According to another specific aspect of a duplexer according to a preferred embodiment of the present invention, the first band-pass filter is a reception filter and the second band-pass filter is a transmission filter.

In a duplexer according to a preferred embodiment of the present invention, any one of the first, second and third signal wire electrodes overlaps with the ground wire electrode or the ground electrode pad extended portion with the interlayer insulating film provided therebetween so that a low-pass filter capacitor is provided, and thus harmonic attenuation is able to be sufficiently increased in the first band-pass filter including an unbalanced-output surface acoustic wave filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of preferred embodiments of the present invention with reference to the drawings.

Figure 2:
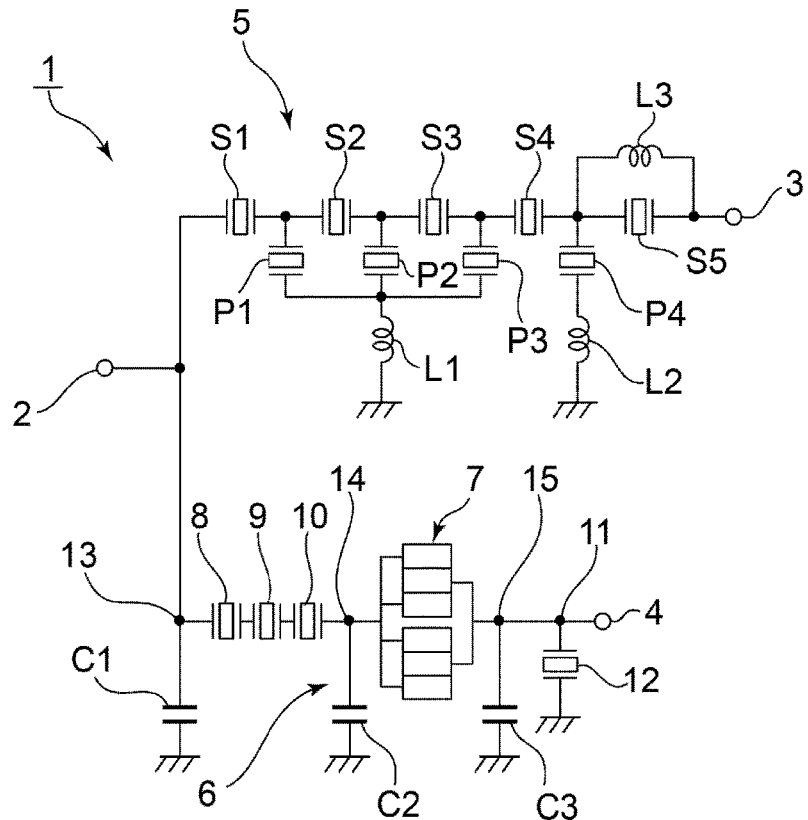
FIG. 2 is a circuit diagram illustrating a duplexer according to a preferred embodiment of the present invention.

FIG. 2 is a circuit diagram illustrating a duplexer according to a preferred embodiment of the present invention. A duplexer 1 includes an antenna terminal 2, a transmission terminal 3, and a reception terminal 4. A transmission filter 5 that defines and functions as a second band-pass filter is connected between the antenna terminal 2 and the transmission terminal 3. The transmission filter 5 is a surface acoustic wave filter having a ladder-type circuit configuration. In other words, a plurality of serial arm resonators S1-S5 and a plurality of parallel arm resonators P1-P4 are each defined by surface acoustic wave resonators. Ground potential-side end portions of the parallel arm resonators P1-P3 are connected in common, and are connected to a ground potential via an inductance L1. A ground potential-side end portion of the parallel arm resonator P4 is shunted to ground via an inductance L2. An inductance L3 is connected in parallel to the serial arm resonator S5.

Note that the circuit configuration of the transmission filter 5 is not particularly limited in the present invention.

Meanwhile, a reception filter 6 that defines and functions as a first band-pass filter is connected between the antenna terminal 2 and the reception terminal 4. A pass-band, or in other words, a reception band of the reception filter 6 is higher than the pass-band of the transmission filter 5.

In the present preferred embodiment, the reception filter 6 includes an unbalanced longitudinally coupled resonator-type surface acoustic wave filter 7. A plurality of single-port surface acoustic wave resonators 8-10 are connected to each other in series between the longitudinally coupled resonator-type surface acoustic wave filter 7 and the antenna terminal 2. A single-port surface acoustic wave resonator 12 is connected between a ground potential and a connection point 11 located between the longitudinally coupled resonator-type surface acoustic wave filter 7 and the reception terminal 4.

A characteristic of the duplexer 1 according to the present preferred embodiment is that low-pass filter capacitors C1-C3 illustrated in FIG. 2 are connected between signal potentials and ground potentials in the reception filter 6. Here, in FIG. 2, the capacitor C1 is connected between a ground potential and a connection point 13 located between the surface acoustic wave resonator 8 and the antenna terminal 2. The capacitor C2 is connected between a ground potential and a connection point 14 located between the surface acoustic wave resonator 10 and the longitudinally coupled resonator-type surface acoustic wave filter 7. The capacitor C3 is connected between a ground potential and a connection point 15 that extends from an output-side end portion of the longitudinally coupled resonator-type surface acoustic wave filter 7.

Figure 1:
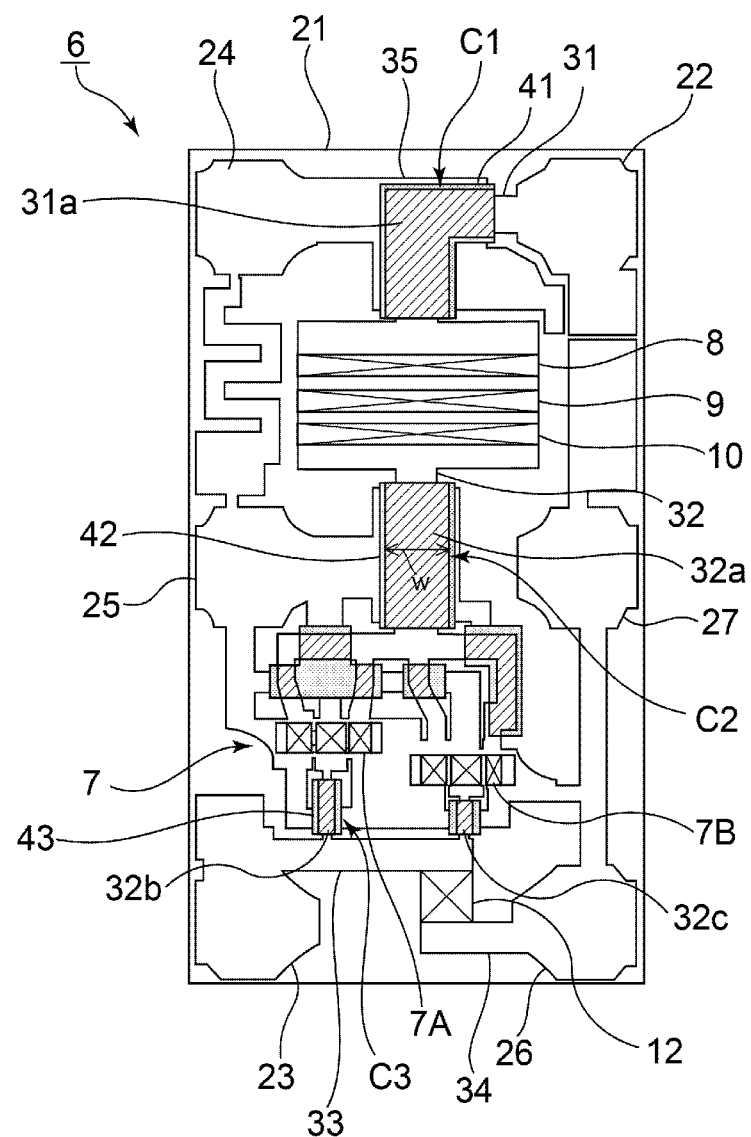
FIG. 1 is a plan view of a surface acoustic wave filter that defines a reception filter in a duplexer according to a preferred embodiment of the present invention.

FIG. 1 is a plan view of the reception filter 6 in the duplexer 1. The reception filter 6 includes a piezoelectric substrate 21. The piezoelectric substrate 21 includes a piezoelectric single-crystal such as LiTiO$_3$, LiNbO$_3$, or the like. However, piezoelectric ceramics may be used instead of a piezoelectric single-crystal.

An electrode structure as illustrated in the drawing is located on the piezoelectric substrate 21. The electrode structure includes a metal material such as Al, Cu, Ag, an alloy that includes one of those metals as its primary component, or the like.

The electrode structure includes an input electrode pad 22 connected to the antenna terminal and an output electrode pad 23 connected to the reception terminal. Ground electrode pads 24-27 that are shunted to ground are provided on the piezoelectric substrate 21. The electrode structure also includes interdigital transducer electrodes that define and are included in the single-port surface acoustic wave resonators 8-10 illustrated in FIG. 2.

In FIG. 1, portions that define interdigital transducer electrodes are indicated by blocks in which Xs are enclosed by rectangles. Meanwhile, three-IDT first and second longitudinally coupled resonator-type surface acoustic wave filter portions 7A and 7B are provided in a portion that defines the longitudinally coupled resonator-type surface acoustic wave filter 7. The portions that define the interdigital transducers are generally indicated by blocks in which Xs are enclosed by rectangles here as well.

Furthermore, an interdigital transducer electrode that defines the single-port surface acoustic wave resonator 12 shown in FIG. 1 is also provided on the piezoelectric substrate 21.

In the electrode structure described above, the portions including the single-port surface acoustic wave resonators 8-10, the longitudinally coupled resonator-type surface acoustic wave filter 7, and a single-port surface acoustic wave resonator 12, or in other words, the portions that define and function as a surface acoustic wave filter, also define and function as a functional electrode portion.

The electrode structure furthermore includes first, second and third signal wire electrodes and a ground wire electrode, described below.

A first signal wire electrode 31 is electrically connected to the input electrode pad 22 and the first single-port surface acoustic wave resonator 8. A second signal wire electrode 32 is a wire portion in the functional electrode portion through which a signal current flows. A third signal wire electrode 33 connects the functional electrode portion and the output electrode pad 23. Meanwhile, a ground wire electrode defines and functions as a wire electrode portion that electrically connects the functional electrode portion and the ground electrode pads 24, 25, 26 or 27. One of the unique features of the present preferred embodiment is that the low-pass filter capacitors C1-C3 are provided.

An interlayer insulating film 41 may be configured using a synthetic resin such as polyimide or a dielectric material such as $SiO_2$.

Figure 3:
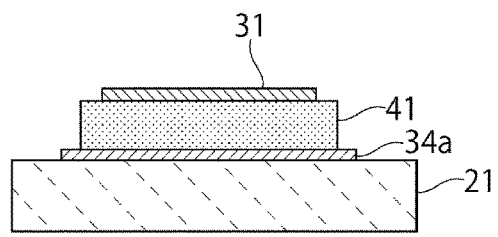
FIG. 3 is a general forward cross-sectional view of a low-pass capacitor portion in a reception filter, according to a preferred embodiment of the present invention.

In order to provide a low-pass filter capacitor, in this bridging area, a width of a portion 31a of the first signal wire electrode 31 is preferably greater than a width of a portion of the first signal wire electrode 31 that is not in the bridging area, as indicated by the diagonal line hatching. Meanwhile, in the bridging area as illustrated in FIG. 3, a planar shape of a ground wire electrode 34a that opposes the first signal wire electrode 31 with the interlayer insulating film 41 therebetween is preferably the same as the first signal wire electrode 31 superimposed thereon or has a shape that is larger than the first signal wire electrode 31. Accordingly, the low-pass filter capacitor C1 having a sufficient electrostatic capacity is provided in the bridging area.

Note that of the low-pass filter capacitors C1-C3 illustrated in FIG. 1, in the low-pass filter capacitor C1, the portion 31a of the first signal wire electrode 31 overlaps with a ground electrode pad extended portion 35, with the interlayer insulating film 41 therebetween. Here, the ground electrode pad extended portion 35 refers to a portion that is connected to the ground electrode pad 24 but is not directly electrically connected to the functional electrode portion. In other words, the ground electrode pad extended portion 35 does not shunt the functional electrode portion to ground. The ground electrode pad extended portion 35 is provided below the interlayer insulating film 41 in order to provide the low-pass filter capacitor C1.

As indicated by an arrow in FIG. 1, the second signal wire electrode 32 overlaps with the ground wire electrodes located below with interlayer insulating films 42 and 43 located therebetween in the low-pass filter capacitors C2 and C3 as well. A width W of a second signal wire electrode portion 32a that overlaps with the ground wire electrode when the piezoelectric substrate is viewed from above is greater than a width of a portion of the second signal wire electrode 32 that does not overlap with the ground wire electrode. In this manner, widths of portions 32a, 32b, and 32c of the second signal wire electrode 32 are greater than widths of the portions of the second signal wire electrode 32 that do not overlap with the ground wire electrode in the areas where the low-pass filter capacitors C2 and C3 are provided as well. Portions of the ground wire electrode that overlap with the second signal wire electrode 32 with the interlayer insulating films 42 and 43 located therebetween also have the same shape as the portions 32a, 32b, and 32c of the second signal wire electrode 32 whose widths are wider, or have a shape that is larger than the portions 32a, 32b, and 32c. Accordingly, the low-pass filter capacitors C2 and C3 are provided with sufficient electrostatic capacitance.

In the duplexer 1 according to the present preferred embodiment, the reception filter 6 includes the unbalanced longitudinally coupled resonator-type surface acoustic wave filter 7. It is difficult to increase harmonic attenuation with the unbalanced longitudinally coupled resonator-type surface acoustic wave filter 7. However, according to the present preferred embodiment, the low-pass filter capacitors C1-C3 are connected between the signal potentials and the ground potentials. Accordingly, a harmonic is effectively attenuated.

It should be noted that in various preferred embodiments of the present invention, as long as the surface acoustic wave filter of the reception filter 6 is unbalanced, that filter is not limited to a longitudinally coupled resonator-type surface acoustic wave filter. A ladder filter may be used, for example. However, a ladder filter requires a large amount of space on the piezoelectric substrate, and it is thus difficult to create a bridging area as described above. As such, it is desirable to use the longitudinally coupled resonator-type surface acoustic wave filter 7 as in the present preferred embodiment. A dimension of a wire in a direction perpendicular to the direction in which the wire extends is taken as the width. In the case where the width is not constant, the width of the portion of the signal wire that overlaps with the portion of the ground wire electrode with the interlayer insulating film located therebetween when the piezoelectric substrate is viewed from above may use an average width Wave obtained by dividing a surface area A of the signal wire that overlaps with the portion of the ground wire electrode by a signal wire length L.

Although the low-pass filter capacitors C1-C3 are provided in the present preferred embodiment, it should be noted that only one of the low-pass filter capacitors C1-C3 may be provided instead. In other words, the number, connection locations, and so on of the low-pass filter capacitors are not particularly limited as long as a low-pass filter capacitor is connected between a signal potential and a ground potential.

Figure 5:
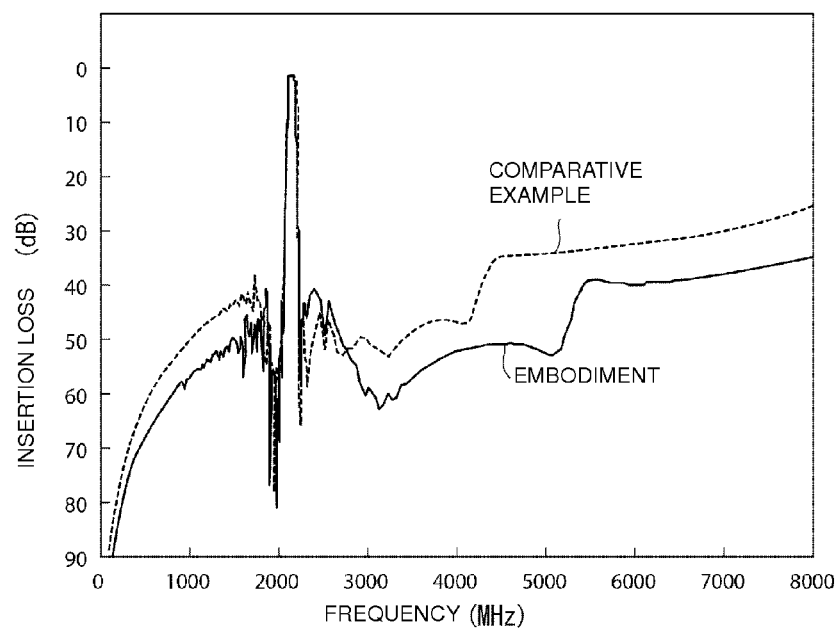
FIG. 5 is a diagram illustrating frequency characteristics of a reception filter in a duplexer according to a preferred embodiment of the present invention and of a reception filter in a duplexer according to a comparative example.

FIG. 5 is a diagram illustrating frequency characteristics of the reception filter 6 in the duplexer 1 according to the aforementioned preferred embodiment and frequency characteristics in a comparative example.

Here, a Band 1 reception filter is provided using the longitudinally coupled resonator-type surface acoustic wave filter 7 including the three-IDT type first and second longitudinally coupled resonator-type surface acoustic wave filter portions 7A and 7B. The pass-band of the Band 1 reception filter is 2110-2170 MHz, for example. As such, a third-order harmonic has a frequency of 6330-6510 MHz, for example.

Figure 4:
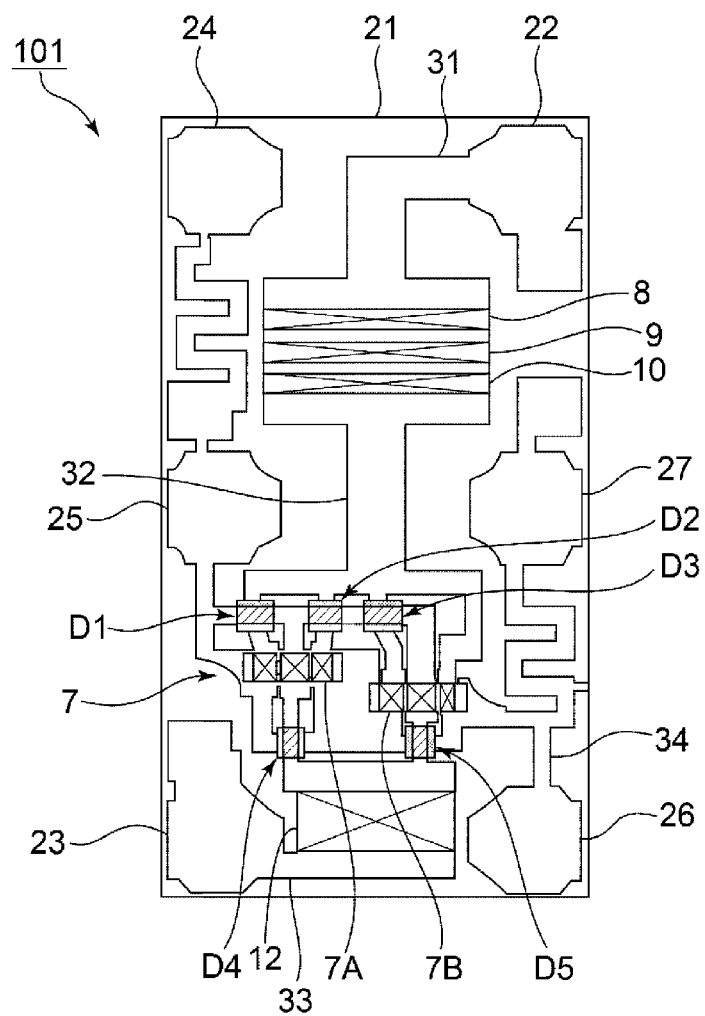
FIG. 4 is a plan view of a surface acoustic wave filter for a reception filter used in a duplexer according to a comparative example.

FIG. 4 is a plan view of a surface acoustic wave filter 101 according to the comparative example. Portions that are the same as those in FIG. 1 have been assigned the same reference numerals. In this comparative example, the low-pass filter capacitors C1-C3 are not provided. In other words, bridging areas are present as indicated by D1-D5. However, these are simply projecting intersecting portions. To be more specific, the configuration is not such that the width of the signal wire portion that overlaps with the ground wire electrode therebelow with an interlayer insulating film located therebetween is greater than the width of the signal wire portion that is not bridging.

A broken line in FIG. 5 indicates the frequency characteristics of the reception filter according to the comparative example that is configured in the same manner as the aforementioned preferred embodiment of the present invention aside from the low-pass filter capacitors C1-C3 not being provided. A solid line indicates the frequency characteristics according to the aforementioned preferred embodiment of the present invention.

In the comparative example, although the bridging areas D1-D5 are provided, the low-pass filter capacitors are not expressly provided, and thus the third-order harmonic attenuation is comparatively low. However, according to the aforementioned preferred embodiment, the low-pass filter capacitors C1-C3 are provided, and thus it is possible to increase the third-order harmonic attenuation by approximately 8 dB, for example.

This is because the low-pass filter capacitors C1-C3 are provided. In other words, this is due to the electrostatic capacitances being inserted in parallel with the signal wires, resulting in an effect in which the electrostatic capacitances define and function as low-pass filters.

In the present invention, of the low-pass filter capacitors C1-C3 in the aforementioned preferred embodiment, one or more of only the low-pass filter capacitor C1 including the ground electrode pad extended portion 35 rather than a ground wire electrode may be provided. Alternatively, one or more of only the low-pass filter capacitor C2, only the low-pass filter capacitor C3, or the like may be provided. The low-pass filter capacitors C2 and C3 preferably include the ground wire electrode rather than the ground electrode pad extended portion 35.

Furthermore, the low-pass filter capacitor C1 that includes the ground electrode pad extended portion 35 and the low-pass filter capacitors C2 and C3 that include ground wire electrodes may be used in tandem, as in the aforementioned preferred embodiment of the present invention.

In the aforementioned preferred embodiment of the present invention, the reception filter 6 includes a longitudinally coupled resonator-type surface acoustic wave filter including three-IDT type first and second surface acoustic wave filter portions. However, in the present invention, the configuration of the functional electrode portion defining the surface acoustic wave filter that defines the reception filter is not limited to the structure described in the aforementioned preferred embodiment of the present invention.

Note that in the duplexer 1 according to the aforementioned preferred embodiment of the present invention, the first band-pass filter is a reception filter and the second band-pass filter is a transmission filter, for example. The present invention is not limited to a reception filter and a transmission filter in this manner, and can be applied broadly to duplexers including first and second band-pass filters that have different pass-bands.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A duplexer comprising:
   a first band-pass filter; and
   a second band-pass filter with a pass-band located on a lower-frequency side compared to that of the first band-pass filter; wherein
   the first band-pass filter includes an unbalanced surface acoustic wave filter including an unbalanced input-unbalanced output;
   the first band-pass filter includes a piezoelectric substrate and an electrode structure provided on the piezoelectric substrate;
   the electrode structure includes an input electrode pad, an output electrode pad, a ground electrode pad that is shunted to ground, a functional electrode portion that defines and functions as a surface acoustic wave filter including at least one interdigital transducer electrode, a first signal wire electrode that connects the functional electrode portion and the input electrode pad, a second signal wire electrode through which a signal current flows within the functional electrode portion, a third signal wire electrode that connects the functional electrode portion and the output electrode pad, and a ground wire electrode that connects the functional electrode portion and the ground electrode pad; and
   a bridging area where any one of the first, second and third signal wire electrodes bridges the ground wire electrode is provided, an interlayer insulating film is provided in the bridging area between the ground wire electrode and the one of the first, second and third signal wire electrodes, and a width of a portion of the signal wire electrode that opposes the ground wire electrode with the interlayer insulating film located therebetween is greater than a width of a portion of the signal wire electrode other than the bridging area so as to define a low-pass filter capacitor.

2. The duplexer according to claim 1, wherein the ground wire electrode is disposed between the interlayer insulating film and the piezoelectric substrate in the area where the low-pass filter capacitor is provided.

3. The duplexer according to claim 1, wherein the unbalanced surface acoustic wave filter is a longitudinally coupled resonator surface acoustic wave filter.

4. The duplexer according to claim 3, wherein a plurality of single-port surface acoustic wave resonators are connected to each other in series between the longitudinally coupled resonator surface acoustic wave filter and an antenna terminal.

5. The duplexer according to claim 4, wherein the plurality of single-port surface acoustic wave resonators include interdigital transducer electrodes.

6. The duplexer according to claim 1, wherein the first band-pass filter is a reception filter and the second band-pass filter is a transmission filter.

7. The duplexer according to claim 6, wherein the transmission filter is a surface acoustic wave filter with a ladder circuit configuration.

8. The duplexer according to claim 1, wherein at least three of the low-pass filter capacitor are provided.

9. The duplexer according to claim 1, wherein the low-pass filter capacitor is connected between a signal potential and a ground potential in the first band-pass filter.

10. The duplexer according to claim 1, wherein in the bridging area, a planar shape of the ground wire electrode that opposes the first signal wire electrode with the interlayer insulating film therebetween is the same as or larger than that of the first signal wire electrode.

11. A duplexer comprising:
   a first band-pass filter; and
   a second band-pass filter with a pass-band located on a lower-frequency side compared to that of the first band-pass filter; wherein
   the first band-pass filter includes an unbalanced surface acoustic wave filter including an unbalanced input-unbalanced output;
   the first band-pass filter includes a piezoelectric substrate and an electrode structure provided on the piezoelectric substrate;
   the electrode structure includes an input electrode pad, an output electrode pad, a ground electrode pad that is shunted to ground, a functional electrode portion that defines and functions as a surface acoustic wave filter including at least one interdigital transducer electrode, a first signal wire electrode that connects the functional electrode portion and the input electrode pad, a second signal wire electrode through which a signal current flows within the functional electrode portion, a third signal wire electrode that connects the functional electrode portion and the output electrode pad, and a ground wire electrode that connects the functional electrode portion and the ground electrode pad; and a ground electrode pad extending portion that extends from the ground electrode pad and is not directly electrically connected to the functional electrode portion is further provided, and the ground electrode pad extending portion overlaps with any one of the first, second and third signal wire electrodes with an interlayer insulating film located therebetween so as to define a low-pass filter capacitor.

12. The duplexer according to claim 11, wherein the ground electrode pad extending portion is disposed between the interlayer insulating film and the piezoelectric substrate in the area where the low-pass filter capacitor is provided.

13. The duplexer according to claim 11, wherein the unbalanced surface acoustic wave filter is a longitudinally coupled resonator surface acoustic wave filter.

14. The duplexer according to claim 13, wherein a plurality of single-port surface acoustic wave resonators are connected to each other in series between the longitudinally coupled resonator surface acoustic wave filter and an antenna terminal.

15. The duplexer according to claim 14, wherein the plurality of single-port surface acoustic wave resonators include interdigital transducer electrodes.

16. The duplexer according to claim 11, wherein the first band-pass filter is a reception filter and the second band-pass filter is a transmission filter.

17. The duplexer according to claim 16, wherein the transmission filter is a surface acoustic wave filter with a ladder circuit configuration.

18. The duplexer according to claim 11, wherein at least three of the low-pass filter capacitor are provided.

19. The duplexer according to claim 11, wherein the low-pass filter capacitor is connected between a signal potential and a ground potential in the first band-pass filter.

20. The duplexer according to claim 11, wherein in the bridging area, a planar shape of the ground wire electrode that opposes the first signal wire electrode with the interlayer insulating film therebetween is the same as or larger than that of the first signal wire electrode.

* * * * *